United States Patent [19]

Gerber et al.

[11] Patent Number: 5,754,135
[45] Date of Patent: May 19, 1998

[54] ANALOG-TO DIGITAL CONVERSION DEVICE HAVING A STANDBY MODE

[75] Inventors: Rémi Gerber; Janick Silloray, both of Nantes, France

[73] Assignee: Matra MHS, Nantes, France

[21] Appl. No.: 684,258

[22] Filed: Jul. 19, 1996

[30] Foreign Application Priority Data

Jul. 20, 1995 [FR] France .................. 95 08804

[51] Int. Cl.[6] ........................................ H03M 1/40
[52] U.S. Cl. .................... 341/163; 341/142; 341/139
[58] Field of Search .................... 341/142, 139, 341/163

[56] References Cited

U.S. PATENT DOCUMENTS 4,392,105  7/1983  McLeod .
4,714,901  12/1987  Jain et al. .
4,953,187  8/1990  Herold et al. .
5,250,914  10/1993  Kondo .
5,461,304  10/1995  Donig .................... 323/315

FOREIGN PATENT DOCUMENTS 0476871  3/1992  European Pat. Off. .

Primary Examiner—Jeffrey A. Gaffin
Assistant Examiner—Jason A. Vick
Attorney, Agent, or Firm—Larson & Taylor

[57] ABSTRACT

This analog-digital conversion device comprises switching means (CS) having two close and centered triggering thresholds; a NOR logic gate (PL) which, when the conversion device is not being used, receives a standby command signal and delivers a zero digital output signal (NOUT) imposed on the input (NIN) of the switching means (CS); preamplification means (PS); and amplification means (AS) receiving a standby command signal and delivering either the digital output signal (NOUT), in the absence of a standby command, or a zero-value signal in the event of a standby command.

6 Claims, 4 Drawing Sheets

ANALOG-TO DIGITAL CONVERSION DEVICE HAVING A STANDBY MODE

FIELD OF THE INVENTION

The present invention relates to an analog-digital conversion device and, more particularly, to a circuit which converts an analog input signal, of sinusoidal, triangular or square type, into a digital output signal.

BACKGROUND OF THE INVENTION

Existing analog-digital converters have various drawbacks.

On the one hand, switching to the upper and lower logic levels takes place by comparison with a reference voltage which is generally delivered by a supply external to the converter circuit proper. This introduction of an external element increases the complexity of the circuit and therefore the design time and manufacturing cost. It also runs the risk of generating thermal noise in the converter circuit, which noise may degrade the performances of this converter circuit. Finally, it leads to static power consumption.

On the other hand, prior art converters operate continuously, even during some phases when, instantaneously, no conversion is required by the rest of the circuit (referred to hereafter as "matrix core"). Their power consumption may be considerable, in particular when the matrix core contains a large number of logic gates, for example of the order of magnitude of 600,000 or even more.

SUMMARY OF THE INVENTION

The object of the present invention is to overcome these drawbacks by proposing an analog-digital converter which has no external structure delivering a reference voltage and is controlled so as to enter a "standby" mode when it is not being used.

The first aspect affords a reduction in the complexity of the circuit designed by the designer and therefore saves space, saves time during design and reduces the manufacturing cost, eliminates the risk of generating additional thermal noise and avoids static power consumption.

The second aspect allows a substantial reduction in the overall power consumption.

The simplified structure of the converter proposed is additionally simple to use and modular.

The circuit according to the invention also has only a small dependence on the load placed at the output, that is to say the value of this load, even when large, causes only a negligible deformation in the waveform of the digital output signal.

In order to achieve the object defined above, the present invention proposes a device, for converting an analog input signal into a digital output signal, which comprises the following elements.

A switching module having two close and centered triggering thresholds and comprising an input and an output delivering a switched signal, the analog input signal being delivered to said input from a first external input via a connection capacitor.

A NOR logic gate with two inputs is provided. A first input of the gate, connected at the output of the switching module, receives the switched signal and a second input of the gate, connected to a second external input of the conversion device, receives a standby command signal when the conversion device is not being used. The NOR logic gate makes it possible, on the one hand, in the absence of a standby mode, to transmit a transmitted switched signal based on the switched signal and, on the other hand, when the conversion device is in standby mode, for which a zero-value analog input signal is imposed on the input of the switching module, to deliver a zero-value digital output signal applied to the input of the switching module.

A preamplification module receives the transmitted switched signal and has a first and a second output delivering a preamplified switched signal based on the transmitted switched signal.

An amplification module receives the preamplified switched signal and the standby command signal and delivers either the digital output signal, in the absence of a standby command, or a zero-value signal in the event of a standby command.

In a particular embodiment, the switching module may comprise two PMOS transistors providing a first threshold comprising triggering thresholds, two NMOS transistors providing a second threshold constituting triggering thresholds, a PMOS transistor switching as a function of the potential difference between the input of the switching module and the first threshold, an NMOS transistor switching as a function of the potential difference between the input of the switching module and the second threshold and an inverter consisting of a PMOS transistor and an NMOS transistor and producing current amplification.

In a particular embodiment, the NOR logic gate may comprise two NMOS transistors in parallel and two PMOS transistors in series.

In a particular embodiment, the preamplification module may comprise an inverter consisting of a PMOS transistor and an NMOS transistor, a first current amplification stage formed by two PMOS transistors and two NMOS transistors, a second current amplification stage which is formed by three successive buffers, each consisting of one PMOS transistor and one NMOS transistor and an output of which constitutes the first output of the preamplification means, and an additional current amplification module which is formed by two inverters, each consisting of one PMOS transistor and one NMOS transistor and the input of which is connected between the output of the first current amplification stage and the input of the second current amplification stage and the output of which constitutes the second output of the preamplification module.

In a particular embodiment, the amplification module may comprise a negative-feedback impedance consisting of two PMOS transistors and of one NMOS transistor, an NMOS transistor and a PMOS transistor for driving the external capacitor which is connected at the output of the amplification means, and a PMOS transistor which contributes, when the conversion device is in standby mode, to the delivery of a zero-value digital output signal.

BRIEF DESCRIPTION OF THE DRAWINGS

Other characteristics and advantages of the present invention will emerge clearly on reading the following detailed description of a particular embodiment which is given by way of nonlimiting example. The description refers to the appended drawings, in which.

DESCRIPTION OF THE PREFERRED EMBODIMENT

The structure of the analog-digital conversion device according to the present invention, represented in FIG. 1, will now be described in detail. In this figure, the connections drawn in broken lines relate to elements which are external to the converter circuit proper.

This converter converts any type of sinusoidal, triangular or square input signals having a peak-to-peak amplitude of 1 volt to 3 volts, given that the lowest voltage is 0 volt. In other words, the device of the invention converts input signals whose mean values are between 0.5 volt and 1.5 volts and whose amplitude is between 0.5 volt and 1.5 volts. The result of this conversion is a logic signal whose waveform is square, falling to a voltage Vss (of 0 volt, for example) at the lower level and rising to a voltage Vdd (of 5 volts, for example) at the upper level.

In addition, the output logic signal has a duty ratio of 50% with a tolerance of plus or minus 10%. This ratio can therefore vary from 45% to 55%, depending on the value of the supply voltage (4.5 to 5.5 volts), the temperature (−55° to 145° C.), the peak-to-peak input amplitude (1 to 3 volts) and also depending on the speed of the manufacturing process, which depends on the etching tolerances (the etching thickness is 0.6 μm, with a tolerance of 5 nm for the length L of the transistors and 10 nm for their width W).

Finally, the conversion circuit of the invention can charge and discharge a capacitor placed at its output without generating a deformation in the waveform of the output logic signal, for a capacitance of 1 to 60 picofarads.

Figure 1:
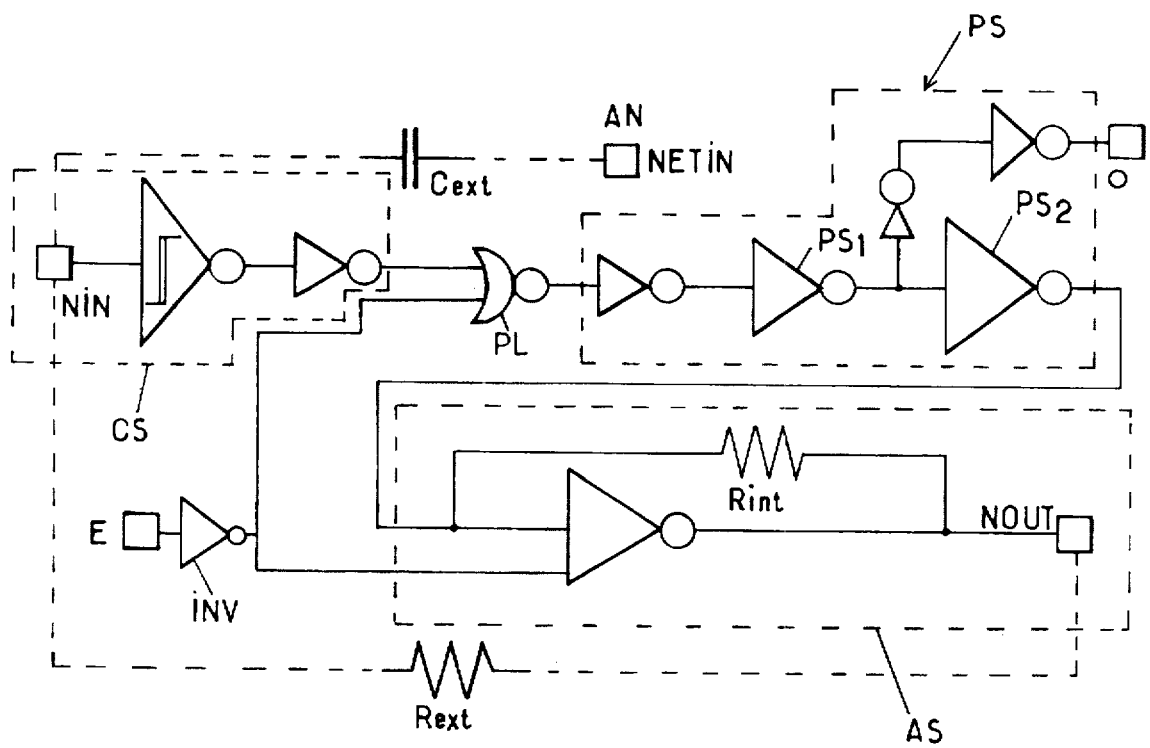
FIG. 1 is a synoptic schematic representation of an analog-digital conversion device according to the present invention.

As shown in FIG. 1, the device is composed of four main elements: a switching module CS, a logic gate PL, a preamplifier module PS and an amplifier module AS.

The switching module CS has two triggering thresholds $VC_1$ and $VC_2$ centered on the voltage Vdd/2 and the values of which are close to each other: the absolute value of the difference between $Vc_1$ and $Vc_2$ is 4% of Vdd, that is to say 200 mV if Vdd=5 V. It should be noted that the difference between the two thresholds is constant, even in the event of a temperature variation, for example (the two thresholds move with each other). The use of centered thresholds is advantageous from the point of view of manufacturing the corresponding transistors, since these transistors are symmetrical and a possible manufacturing defect will therefore also be symmetrical.

Let AN be the analog input signal of the conversion device and let NOUT be the digital output signal. The signal AN, consisting of a static component and a dynamic component, is delivered to a first external input NETIN of the device. A capacitor Cexr is connected between the external input NETIN and the input NIN of the switching module CS. The role of the capacitor Cext is to suppress the static component of the analog input signal AN in order to deliver only its dynamic component to the input NIN of the switching module CS. This module also receives at its input NIN the output signal of the amplifier module AS, the output of the module AS being connected to the input NIN of the module CS via a resistor Rext.

The output of the switching module Cs is connected to an input of a NOR logic gate PL which therefore receives the switched signal. The function of this logic gate PL is to set the conversion device according to the invention to standby mode. To this end, the second input of the NOR gate PL is connected to a second external input E of the device. So long as the device is actually being used, the gate PL transmits the switched signal. When the conversion device is not being used, the input E is set to 0 volt. The output signal NOUT of the amplifier module AS is therefore zero and is applied to the input NIN of the switching module CS. The output signal of the module CS is also zero. When receiving as input the input E signal conditioned by an inverter INV, the gate PL sends a zero signal into the preamplifier module PS, which delivers an output signal equal to Vdd. The conversion device is therefore off and consumes no power.

The function of the preamplifier module PS is to produce progressive amplification of the dynamic current to be transmitted to the output amplifier module AS. It also makes it possible to generate, at an output O of the device, a digital signal identical to the digital output signal NOUT. This output O makes it possible to drive structures located in the matrix core without them being affected by the propagation time of the device of the invention.

The fourth main constituent element of the device of the invention is the amplifier module AS. It comprises a negative-feedback impedance Rint connected between the output of the module AS and that input of the module AS which is connected to the output of the preamplifier module PS. When the conversion device is actually being used, that is to say in the absence of a standby command, the module AS delivers a digital output signal NOUT obtained after analog-digital conversion from the analog input signal AN. When a standby command is given, as described above, the signal delivered to the second external input E of the device is zero (equal to Vss). The inverter INV therefore delivers a voltage Vdd to that input of the module AS to which the inverter INV is connected. The effect of this is to set the output of the module AS, and therefore the input NIN of the module CS, to 0 volt. The standby mode is thus established.

Figure 2:
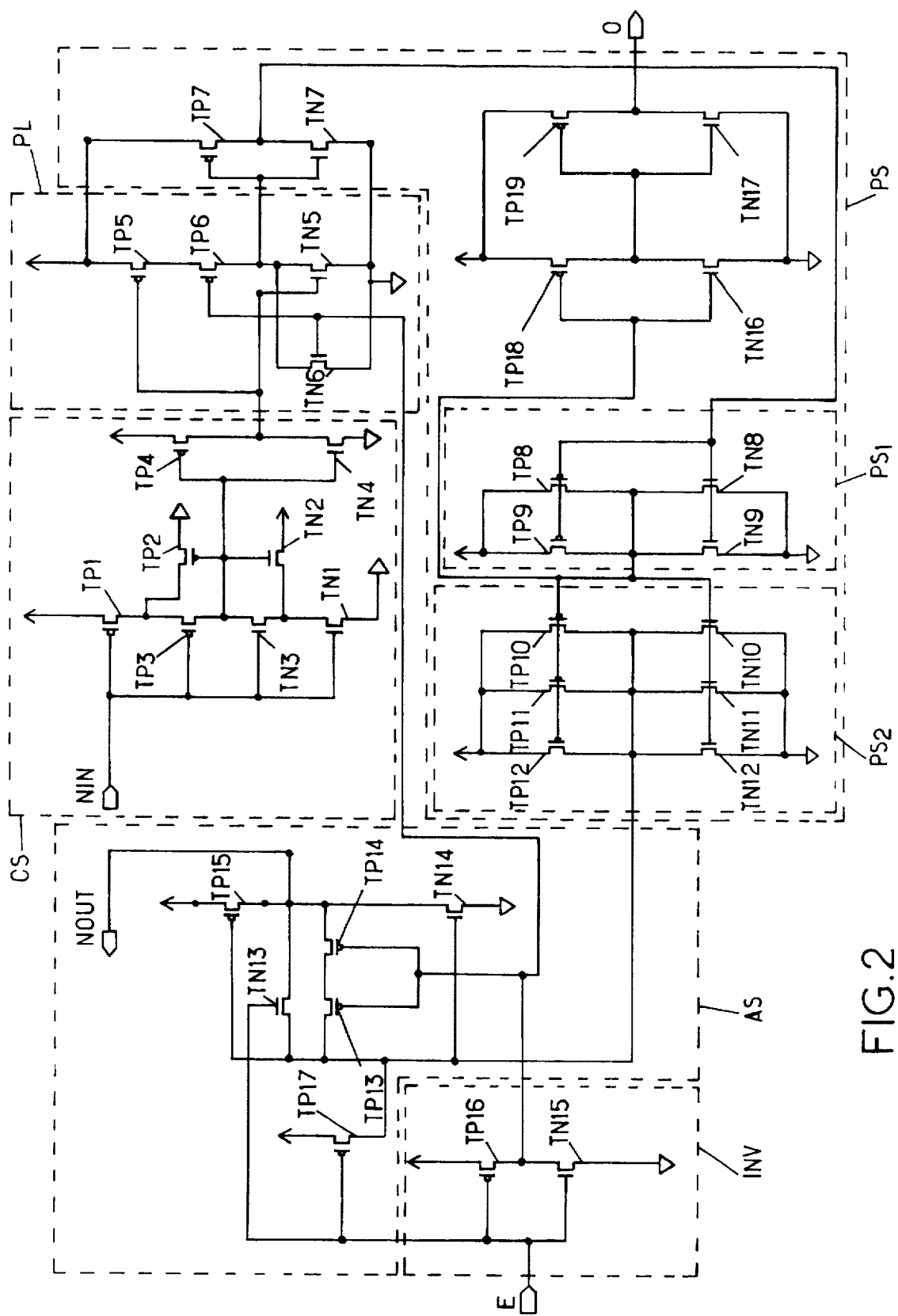
FIG. 2 is a circuit diagram of the device of the present invention in a particular embodiment based on N-type and P-type MOS transistors.

In a particular embodiment, the four main elements of the invention are made from PMOS and NMOS transistors. The corresponding circuit diagram is represented in FIG. 2. The arrows represent the connections to the supply voltage Vdd and the triangles represent the connections to the ground voltage Vss. In this figure, only the analog-digital device proper has been represented. Thus, the capacitor Cext and the resistor Rext are not shown.

The reference signs relating to the PMOS transistors start with "TP" and those denoting the NMOS transistors start with "TN". Thus, for the sake of simplicity, a transistor will henceforth be denoted only by the corresponding reference sign, without adding "PMOS" or "NMOS".

The switching module CS comprises the transistors TP1 to TP4 and TN1 to TN4. The transistors TP1 and TP2 provide a first triggering threshold $VC_1$ and the transistors TN1 and TN2 provide a second triggering threshold $VC_2$. The transistors TP3 and TN3 are subjected to the variations in the signal delivered to the input NIN and switch, respectively as a function of the potential difference between the input NIN and the threshold $VC_1$, and as a function of the potential difference between the input NIN and the threshold $VC_2$.

Because of the dimensioning of the input transistors of the module CS, namely TP1 to TP3 and TN1 to TN3, the mean value of the output signal of the amplifier module AS delivered to the input NIN is very close to the switching thresholds $VC_1$ and $VC_2$ of the module CS. The input transistors of the module CS which are used should therefore have relatively high precision. This is why a greater length L has been chosen for the transistors TP1 to TP3 and TN1 to TN3 than for the other transistors of the device. The reason for this is that the relative imprecision in length due to the manufacturing process will in this case be less than for shorter transistors. By way of indication, the lengths of the transistors TP1 to TP3 and TN1 to TN3 are five to ten times greater than the minimum sizes. In addition, the dimensions of these transistors are such that they permit identical voltage and temperature behavior of the triggering thresholds $VC_1$, $VC_2$ and of the mean value of the output signal of the amplifier module AS. This optimally compensates for the supply drifts and the thermal drifts, and the duty ratio is thus preserved.

The transistors TP4 and TN4 placed at the output of the module CS form an inverter which conserves the voltage behavior of this module while increasing the output current in order to control the following module better, that is to say the NOR logic gate PL.

The structure of this gate is conventional. It comprises two transistors TN5, TN6 in parallel and two transistors TP5, TP6 in series. At one input, the logic gate PL receives the input E signal conditioned by the abovementioned inverter INV formed by two transistors TP16 and TP15.

The preamplifier module PS comprises, connected at the output of the gate PL, an inverter consisting of two transistors TP7 and TN7, then, connected at the output thereof, a first current amplification stage $PS_1$ consisting of four transistors TP8, TN8, TP9, TN9, then a second current amplification stage PS2 connected between the output of the first current amplification stage PS1 and an input of the amplifier module AS. The second stage PS2 is composed of three successive inverter buffers having an increasing current drive capacity, that is to say the amplification of the current takes place progressively. These three buffers each consist of two transistors, respectively TP10 and TN10, TP11 and TN11, TP12 and TN12.

An additional current amplification module between the output of the first stage $PS_1$ and the input of the second stage $PS_2$. It comprises two inverters, each consisting of two transistors, respectively TP18 and TN16, TP19 and TN17. The output of this additional current amplification module constitutes the output O which was mentioned above and is intended to be connected to the matrix core.

The negative-feedback impedance Rint contained in the amplifier module AS consists of three transistors TN13, TP13 and TP14. It turns on two transistors TP15, TN14, placed at the output of the module AS, which act as a current amplifier and serve to drive a capacitor optionally connected to this output. The transistors TP15 and TN14 are chosen with sufficiently large size to be able to drive a capacitance of up to 60 picofarads.

The output amplification module AS also comprises a transistor TP17 which, when a standby command is given, contributes to the establishment of a voltage Vdd at the output of the preamplifier module PS. With the transistor TN14, the transistor TP17 also makes it possible to set the output of the amplifier module AS to 0 volt.

Figure 3A:
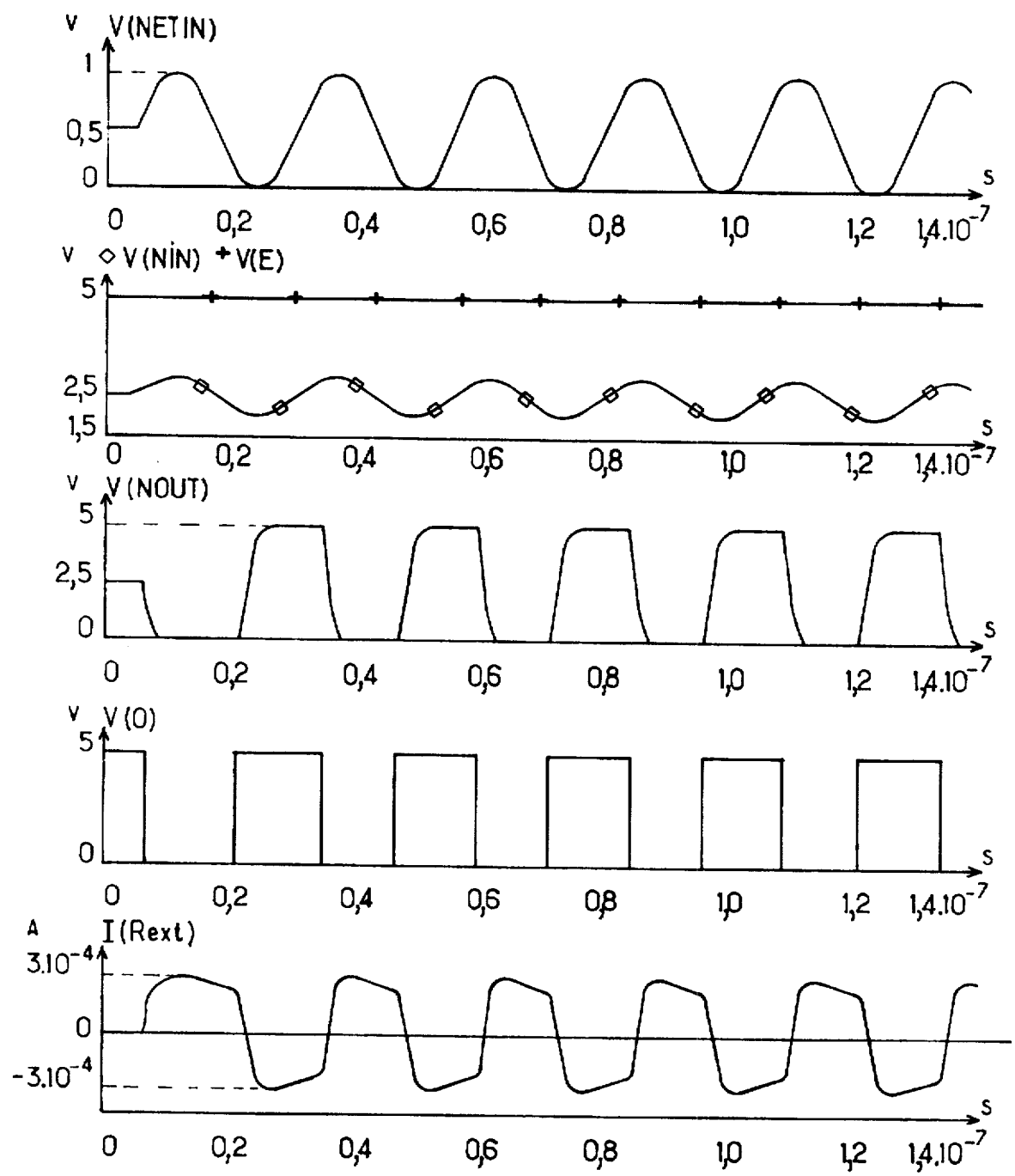
FIGS. 3a and 3b represent time diagrams of the voltages at the inputs and outputs of the device of the present invention, in the embodiment in FIG. 2, as well as a curve showing the time dependence of the strength of the current between the output of the amplification module and the input of the switching module, illustrating the results obtained respectively in the case of a sinusoidal analog input signal having a peak-to-peak amplitude of 1 volt and 3 volts.
Figure 3B:
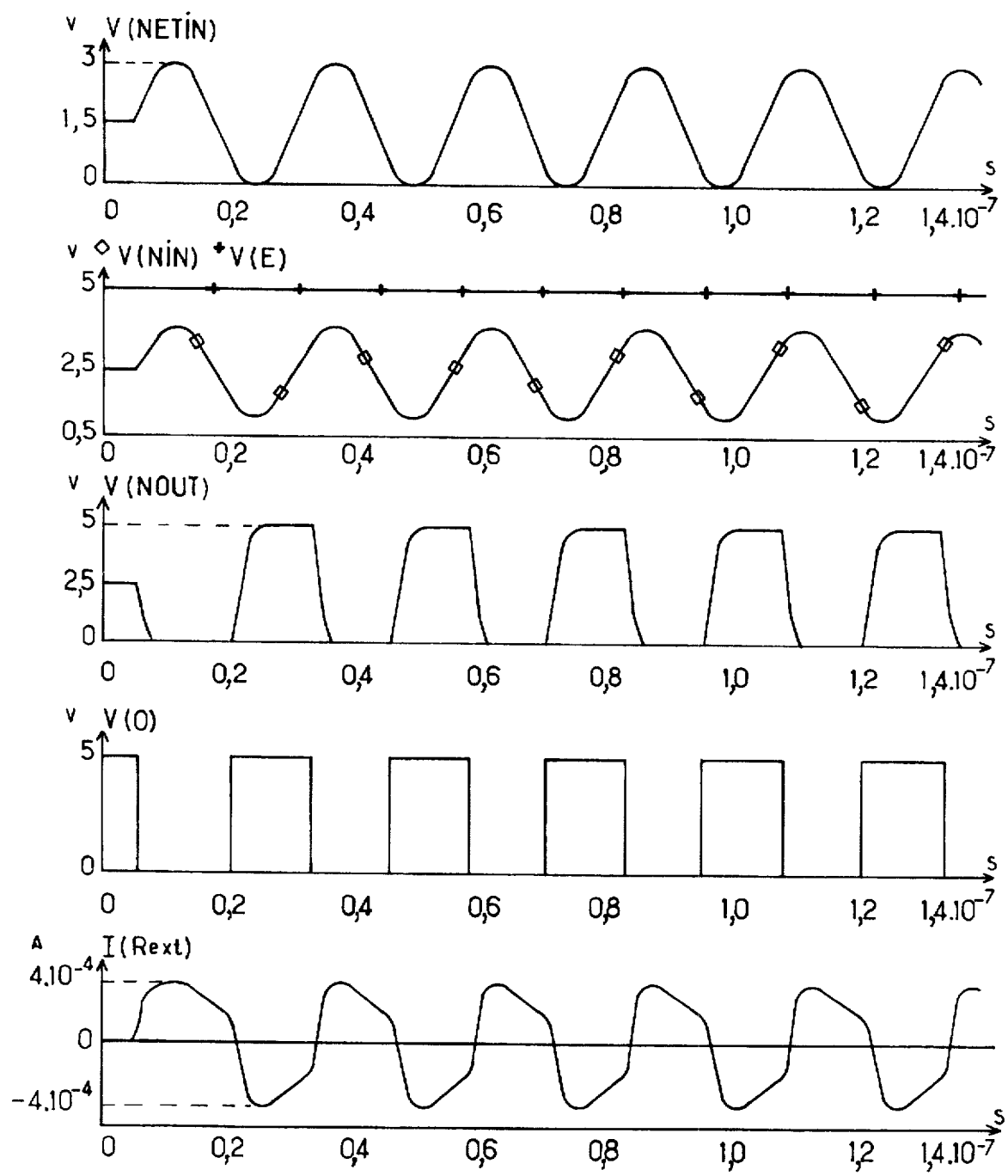

FIGS. 3a and 3b give the result obtained with a sinusoidal analog input signal. The curves represent, as a function of time, the respective voltages, in volts, V(NETIN) at the first external input NETIN of the device, V(E) as its second external input E, V(NIN) at the input NIN of the amplifier module AS (the digital output signal NOUT is found there), and V(O) at the output 0 of the preamplifier module PS. An additional curve represents the strength, in amps, I(Rext) of the current flowing through the resistor Rext between the output of the module AS and the input NIN of the module CS.

FIG. 3a illustrates a case in which the peak-to-peak amplitude of the sinusoidal input signal AN is 1 V and its mean value is 0.5 V. In the case illustrated, the device is used continuously, without entering standby mode. The voltage at the input E is therefore constant and equal to Vdd=5 V. The output signal NOUT is almost square. The signal observed at the output O, delivered to the matrix core, is square. The output signal NOUT is somewhat degraded in comparison with the output signal at O because its power is higher. However, the duty ratio and the phase of the output signal NOUT are identical to those of the signal observed at O.

FIG. 3b has the same operating conditions but in the case of a sinusoidal input signal AN with peak-to-peak amplitude 3 V and mean value 1.5 V.

We claim:

1. A converting device for converting an analog input signal into a digital output signal, said device comprising:
   switching means having two close and centered triggering thresholds and comprising an input and an output delivering a switched signals, said analog input signal being delivered to said input from a first external input of said converting device through a connection capacitor;
   a NOR logic gate with first and second inputs, said first input being connected to the output of said switching means and receiving said switched signal, and said second input being connected to a second external input of said converting device and receiving a standby command signal when said converting device is not being used, said NOR logic gate, in the absence of a said standby command signal, transmitting a transmitted switched signal based on said switched signal, and, in the presence of a said standby command signal, and with a zero-value analog input signal imposed on said input of said switching means, producing a zero-value digital output signal applied to said input of said switching means;
   preamplification means for receiving said transmitted switched signal and having a first output and a second output for producing a preamplified switched signal based on said transmitted switched signal; and
   amplification means for receiving said preamplified switched signal and said standby command signal and for producing said digital output signal in the absence of a said standby command signal and producing a zero-value signal in the presence of a said standby command signal.

2. The device of claim 1, wherein said analog input signal is one of a sinusoidal type, a triangular type or a square type.

3. The device of claim 1, wherein said switching means comprise two PMOS transistors providing a first threshold, two NMOS transistors providing a second threshold which switches as a function of the potential difference between said input of said switching means and said first threshold, a NMOS transistor which switches as a function of the potential difference between said input of said switching means and said second threshold, and an inverter, comprising a PMOS transistor and a NMOS transistor, for producing current amplification.

4. The device of claim 1, wherein said NOR logic gate comprises two NMOS transistors connected in parallel and two PMOS transistors connected in series.

5. The device of claim 1, wherein said preamplification means comprise an inverter comprising a PMOS transistor and a NMOS transistor, a first current amplification stage formed by two PMOS transistors and two NMOS transistors, a second current amplification stage formed by three successive buffers, each of said buffer comprising one PMOS transistor and one NMOS transistor and an output of one of said buffers constituting said first output of said preamplification means, and an additional current amplification module formed by two inverters, each of said two inverters comprising one PMOS transistor and one NMOS transistor, and said amplification module being connected between the output of said first current amplification stage and the input of said second current amplification stage and having an output constituting said second output of the preamplification means.

6. The device of claim 1, wherein said amplification means comprises a negative-feedback impedance circuit comprising two PMOS transistors and one NMOS transistor, a NMOS transistor and a PMOS transistor for driving the external capacitor connected to the output of said amplification means, and a PMOS transistor for assisting, in the presence of a said standby command signal, producing of a said zero-value digital output signal.

* * * * *